United States Patent
Fu et al.

(10) Patent No.: US 10,937,774 B2
(45) Date of Patent: Mar. 2, 2021

(54) MICRO LED DISPLAY PANEL, METHOD FOR FABRICATING THE SAME AND DISPLAY DEVICE

(71) Applicant: SHANGHAI TIANMA MICRO-ELECTRONICS CO., LTD., Shanghai (CN)

(72) Inventors: Jujian Fu, Shanghai (CN); Gang Liu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/264,495

(22) Filed: Jan. 31, 2019

(65) Prior Publication Data

US 2019/0164946 A1    May 30, 2019

(30) Foreign Application Priority Data

Sep. 30, 2018   (CN) .......................... 201811160756.7

(51) Int. Cl.
*H01L 25/16* (2006.01)
*H01L 21/683* (2006.01)
(Continued)

(52) U.S. Cl.
CPC ........ *H01L 25/167* (2013.01); *H01L 21/6835* (2013.01); *H01L 24/32* (2013.01);
(Continued)

(58) Field of Classification Search
CPC ... H01L 25/167; H01L 25/0753; H01L 24/32; H01L 24/83; H01L 33/52; H01L 33/42; H01L 33/505; H01L 33/62
See application file for complete search history.

(56) References Cited

U.S. PATENT DOCUMENTS

| 10,319,697 B2 | 6/2019 | Zou et al. |
| 2017/0207249 A1 | 7/2017 | Rhee |
| (Continued) | | |

FOREIGN PATENT DOCUMENTS

| CN | 105493297 A | 4/2016 |
| CN | 106941108 A | 7/2017 |
| CN | 108022936 A | 5/2018 |

OTHER PUBLICATIONS

Office Action of Chinese Patent Application No. 201811160756.7 dated Mar. 2, 2020.

*Primary Examiner* — Sue A Purvis
*Assistant Examiner* — Scott Stowe
(74) *Attorney, Agent, or Firm* — Kilpatrick Townsend & Stockton, LLP

(57) ABSTRACT

A Micro LED display panel, a method for fabricating the Micro LED display panel and a display device are provided. When the LED chip array is transferred, it may only be required to embed the LED chip array into the adhesive film layer. The LED chip array is bonded to the array substrate through the adhesive film layer. Then, unnecessary portions of the adhesive film layer and unnecessary LED chips are removed. It is not necessary to attach LED chips in the LED chip array one by one to the substrate by soldering, in which case the process of fabricating the Micro LED display panel is simplified, the difficulty in fabricating the Micro LED display panel is reduced, the influence of the high temperature generated by the soldering process on the LED chips is avoided, and damage to the LED chips during the transfer process is avoided.

7 Claims, 11 Drawing Sheets

(51) Int. Cl.
    *H01L 23/00*     (2006.01)
    *H01L 33/52*     (2010.01)
    *H01L 25/075*     (2006.01)
    *H01L 33/62*     (2010.01)
    *H01L 33/50*     (2010.01)
    *H01L 33/42*     (2010.01)
    *H01L 33/56*     (2010.01)

(52) U.S. Cl.
    CPC .......... H01L 24/83 (2013.01); H01L 25/0753 (2013.01); H01L 33/52 (2013.01); *H01L 33/42* (2013.01); *H01L 33/504* (2013.01); *H01L 33/505* (2013.01); *H01L 33/508* (2013.01); *H01L 33/56* (2013.01); *H01L 33/62* (2013.01); *H01L 2224/32145* (2013.01); *H01L 2224/83855* (2013.01); *H01L 2933/005* (2013.01); *H01L 2933/0041* (2013.01); *H01L 2933/0066* (2013.01)

(56) References Cited

U.S. PATENT DOCUMENTS

| | | |
|---|---|---|
| 2018/0122837 A1 | 5/2018 | Kang et al. |
| 2018/0166429 A1* | 6/2018 | Chong .................... H01L 33/00 |
| 2018/0342691 A1 | 11/2018 | Lu |

* cited by examiner

MICRO LED DISPLAY PANEL, METHOD FOR FABRICATING THE SAME AND DISPLAY DEVICE

This application claims the priority to Chinese patent application No. 201811160756.7 titled "MICRO LED DISPLAY PANEL, METHOD FOR FABRICATING THE SAME AND DISPLAY DEVICE", filed with the Chinese Patent Office on Sep. 30, 2018, which is incorporated herein by reference in its entirety.

FIELD

The present disclosure relates to the field of displays, and particularly to a Micro LED display panel, a method for fabricating the Micro LED display panel, and a display device.

BACKGROUND

A Light Emitting Diode (LED) is a semiconductor component that converts a current into light in a specific wavelength range. The principle of light emitting is that an energy difference due to electrons moving between an n-type semiconductor and a p-type semiconductor causes releasing of energy in a form of light. Therefore, the light emitting diode is called a cold light source, and is widely used due to the advantages of low power consumption, a small size, high brightness, easy matching with integrated circuits and high reliability. Moreover, with the maturity of LED technologies, LEDs are increasingly widely used as pixels in a self-emission display device such as an LED display or a Micro LED (i.e., miniature LED) display.

The Micro LED display combines the characteristics of the TFT-LCD (thin film transistor-liquid crystal display) and the LED display. The LED structures are thinned, miniaturized and arrayed to form Micro LEDs on an original growth substrate and is transferred to a circuit substrate. One of the difficulties in the development of the Micro LED technology is the transfer process of the Micro LED. The current transfer process is complicated.

SUMMARY

In view of this, a Micro LED display panel, a method for fabricating the Micro LED display panel, and a display device are provided according to the present disclosure, in order to reduce the difficulty in fabricating a Micro LED display panel, and avoid damage to LED chips during the transfer process.

A method for fabricating a Micro LED display panel is provided, which includes:
  preparing a carrier substrate;
  forming an adhesive film layer on a surface of the carrier substrate, where the adhesive film layer includes a retaining region and a removal region;
  embedding an LED chip array carried by a transfer substrate into the adhesive film layer, and separating the LED chip array from the transfer substrate, where the LED chip array includes multiple LED chips; and
  exposing and developing the adhesive film layer, to remove the removal region of the adhesive film layer and LED chips in the removal region.

Correspondingly, a method for fabricating a Micro LED display panel is provided according to the present disclosure, which includes:

step S1, preparing an array substrate, where the array substrate includes a transistor array layer, the transistor array layer includes multiple pixel point regions, and each of the multiple pixel regions is provided with at least one transistor;
  performing the following steps S2 to S4 at least once, including:
    step S2, forming an adhesive film layer on a surface of the array substrate on which the transistor array layer is provided, where the adhesive film layer includes a retaining region and a removal region,
    step S3, embedding an LED chip array carried by a transfer substrate into the adhesive film layer, and separating the LED chip array from the transfer substrate, where the LED chip array includes multiple LED chips, and
    step S4, exposing and developing the adhesive film layer, to remove the removal region of the adhesive film layer and LED chips in the removal region, where LED chips in the retaining region are in one-to-one correspondence with the pixel point regions of the transistor array layer; and
  step S5, forming an anode connecting electrode connecting an anode of each of the LED chips and a source or a drain of the transistor in one of the pixel point regions corresponding to the LED chip, and fabricating a cathode connecting electrode in contact with a cathode of the LED chip, to obtain a Micro LED display panel.

Correspondingly, a Micro LED display panel is provided according to the present disclosure, which includes an array substrate, an adhesive film layer and multiple LED chips.

The array substrate includes a transistor array layer, the transistor array layer includes multiple pixel point regions, and each of the multiple pixel point regions of the transistor array layer is provided with at least one transistor.

The adhesive film layer is located on a surface of the array substrate on which the transistor array layer is provided.

The multiple LED chips are embedded into the adhesive film layer. The multiple LED chips are in one-to-one correspondence with the multiple pixel point regions of the transistor array layer, an anode of each of the multiple LED chips is connected with a source or a drain of the transistor in a corresponding one of the multiple pixel point regions through an anode connecting electrode, and a cathode of each of the multiple LED chips is connected with a cathode connecting electrode.

Correspondingly, a Micro LED display device is provided in the present disclosure, including the above Micro LED display panel.

A Micro LED display panel, a method for fabricating the Micro LED display panel, and a display device are provided according to the present disclosure. A Micro LED display panel is fabricated by the following process. First, the adhesive film layer is formed on the surface of the carrier substrate or the surface of the array substrate on which the transistor array layer is provided. Then, the LED chip array carried by the transfer substrate is embedded into the adhesive film layer, and the LED chip array is separated from the transfer substrate. Next, the adhesive film layer is exposed and developed to remove the removal region of the adhesive film layer and the LED chips in the removal region. After the LED chip array is bonded to the array substrate, the LED chips in the removal region are removed, and the LED chips in the retaining region have one-to-one correspondence with the pixel point regions in the transistor array layer. Then, the anode connecting electrode that connects the anode of each of the LED chips and the source or the drain of the corresponding transistor, and the cathode connecting electrode that is in contact with the cathode of the LED chip are formed.

In one embodiment, when the LED chip array is transferred, it may only be required to embed the LED chip array into the adhesive film layer. The LED chip array is bonded to the carrier substrate or the array substrate through the adhesive film layer. Then, unnecessary portions of the adhesive film layer and unnecessary LED chips are removed, and the transfer process is finished. It is not necessary to attach LED chips in the LED chip array one by one to the substrate by soldering, in which case the process of fabricating the Micro LED display panel is simplified, the difficulty in fabricating the Micro LED display panel is reduced, the influence of the high temperature generated by the soldering process on the LED chips is avoided, and damage to the LED chips during the transfer process is avoided.

BRIEF DESCRIPTION OF THE DRAWINGS

The drawings to be used in the description of the embodiments will be described briefly as follows and accordingly the embodiments of the present disclosure will become clearer. It is apparent that the drawings in the following description only illustrate some embodiments of the present disclosure.

DETAILED DESCRIPTION

As described in the background, the Micro LED display combines the characteristics of the TFT-LCD and the LED display. The LED structures are thinned, miniaturized and arrayed to form Micro LEDs on an original growth substrate and is transferred to a circuit substrate. One of the difficulties in the development of the Micro LED technology is the transfer process of the Micro LED. The current transfer process is complicated.

Based on this, a Micro LED display panel, a method for fabricating the Micro LED display panel, and a display device are provided according to the present disclosure, in order to reduce the difficulty in fabricating a Micro LED display panel, and avoid damage to LED chips during the transfer process.

Figure 1:
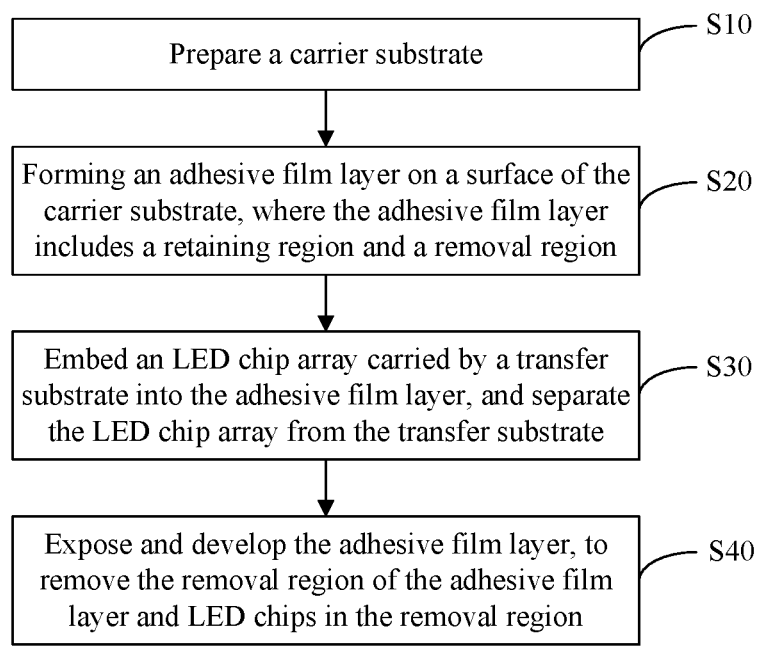
FIG. 1 is a flowchart of a method for fabricating a Micro LED display panel according to an embodiment of the present disclosure.

Referring to FIG. 1, which is a flowchart of a method for fabricating a Micro LED display panel according to an embodiment of the present disclosure, the method includes the following steps S10 to S40.

In step S10, a carrier substrate is prepared.

In step S20, an adhesive film layer is formed on a surface of the carrier substrate. The adhesive film layer includes a retaining region and a removal region.

In step S30, an LED chip array carried by a transfer substrate is embedded into the adhesive film layer, and the LED chip array is separated from the transfer substrate. The LED chip array includes multiple LED chips.

In step S40, the adhesive film layer is exposed and developed, to remove the removal region of the adhesive film layer and LED chips in the removal region.

It should be noted that, the division of the retaining region and the removal region of the adhesive film layer is not limited in the embodiments of the present disclosure, and is designed according to practical applications. Moreover, the Micro LED display panel provided according to the embodiments of the present disclosure can also be used for a light emitting panel structure.

It is to be understood, a Micro LED display panel is fabricated by the following process. First, the adhesive film layer is formed on a surface of the carrier substrate. Then, an LED chip array carried by the transfer substrate is embedded into the adhesive film layer, and the LED chip array is separated from the transfer substrate. Next, the adhesive film layer is exposed and developed to remove the removal region of the adhesive film layer and the LED chips in the removal region. In this way, distribution of the LED chips in a predetermined pattern is obtained. Finally, the retaining region of the adhesive film layer is cured on the surface of the carrier substrate.

In an embodiment of the present disclosure, the carrier substrate according to the present disclosure may be a circuit board. A power supply line is provided on the carrier substrate, and the power supply line is connected to the LED chips. The LED chips on the carrier substrate are driven by a control device which is electrically connected to the power supply line such that the LED chips are driven in a passive mode.

In one embodiment, when the LED chip array is transferred, it may only be required to embed the LED chip array into the adhesive film layer. The LED chip array is bonded to the carrier substrate through the adhesive film layer. Then, unnecessary portions of the adhesive film layer and unnecessary LED chips are removed, and the transfer process is finished. It is not necessary to attach LED chips in the LED chip array one by one to the substrate by soldering, in which case the process of fabricating the Micro LED display panel is simplified, the difficulty in fabricating the Micro LED display panel is reduced, the influence of the high temperature generated by the soldering process on the LED chips is avoided, and damage to the LED chips during the transfer process is avoided.

Further, in the LED chip array according to one embodiment of the present disclosure, an anode and a cathode of each of the LED chips are exposed on a side of the LED chips facing away from the carrier substrate, in order to facilitate subsequent connection to the anode or the cathode of the LED chip.

Figure 2:
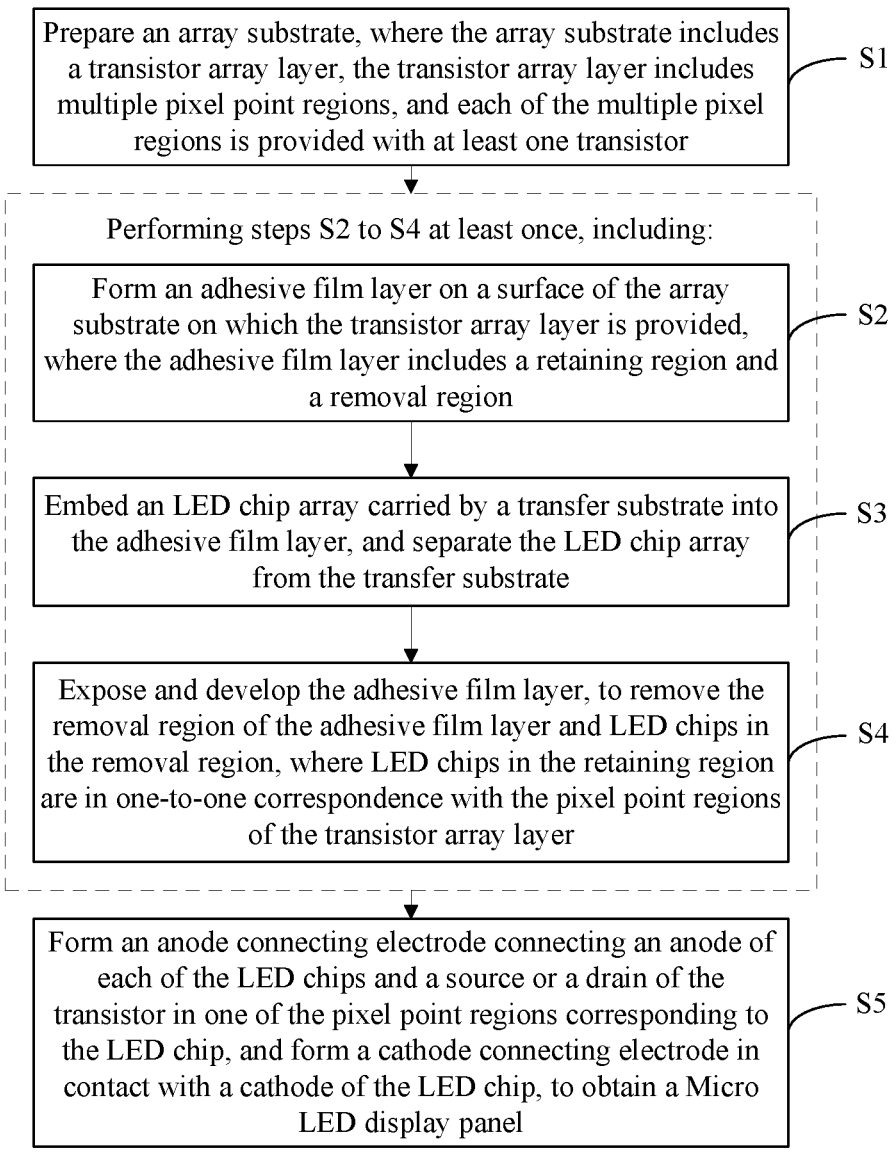
FIG. 2 is a flowchart of a method for fabricating a Micro LED display panel according to another embodiment of the present disclosure.

Correspondingly, a method for fabricating a Micro LED display panel is further provided according to an embodiment of the present disclosure. Referring to FIG. 2, which is a flow chart of a method for fabricating a micro LED display panel according to another embodiment of the present disclosure, the method includes the following steps S1 to S5.

In step S1, an array substrate is provided. The array substrate includes a transistor array layer, the transistor array layer includes multiple pixel point regions, and each of the multiple pixel regions is provided with at least one transistor.

Then, the following steps S2 to S4 are performed at least once.

In step S2, an adhesive film layer is formed on a surface of the array substrate on which the transistor array layer is provided. The adhesive film layer includes a retaining region and a removal region.

In step S3, an LED chip array carried by a transfer substrate is embedded into the adhesive film layer, and the LED chip array is separated from the transfer substrate. The LED chip array includes multiple LED chips.

In step S4, the adhesive film layer is exposed and developed, to remove the removal region of the adhesive film layer and LED chips in the removal region. LED chips in the retaining region are in one-to-one correspondence with the pixel point regions of the transistor array layer.

In step S5, an anode connecting electrode and a cathode connecting electrode are formed, to obtain a Micro LED display panel. The anode connecting electrode connects an anode of each of the LED chips and a source or a drain of the transistor in one of the pixel point regions corresponding to the LED chip. The cathode connecting electrode is in contact with a cathode of the LED chip.

It should be noted that, in the embodiments of the present disclosure, the boundary between the retaining region and the removal region of the provided adhesive film layer needs to be designed according to practical applications. For example, the retaining region and the removal region are divided according to the correspondence between the LED chips emitting light of different colors and the pixel point regions of the transistor array layer. In addition, each of the pixel point regions of the transistor array layer according to the embodiments of the present disclosure corresponds to one LED chip, and each of the pixel point regions of the transistor array layer according to the embodiments of the present disclosure may be provided with one or more transistors, one of which is electrically connected to the LED chip. For example, the transistor connected to the LED chip may be a driving transistor that supplies a driving current to the LED chip. In a case that the pixel point region of the transistor array layer include a pixel driving circuit, and the pixel driving circuit includes multiple functional transistors in addition to the driving transistor, the LED chip may be directly connected to the driving transistor, and is driven by the driving transistor and the functional transistors. In one embodiment, the transistor connected to the LED chip may be a light emitting control transistor provided between the driving transistor and the LED chip, which is not limited in this disclosure.

It should be understood that, the Micro LED display panel is fabricated by the following process. First, the adhesive film layer is formed on a surface of the array substrate on which the transistor array layer is provided. Then, the LED chip array carried by the transfer substrate is embedded into the adhesive film layer and the LED chip array is separated from the transfer substrate. Next, the adhesive film layer is exposed and developed to remove the removal region of the adhesive film layer and the LED chips attached with the adhesive film layer in the removal region. Then, the retaining region of the adhesive film layer is cured (it should be noted that, the retaining region of the adhesive film layer may be cured during the exposure and development process, or may be cured after the removal region of the adhesive film layer is removed, which may not be specifically limited in the disclosure). The LED chips in the retaining region are in one-to-one correspondence with the pixel point regions of the transistor array layer. The transistors in the pixel point regions are respectively connected to corresponding LED chips to serve as switch structures for supplying power to the LED chips. Moreover, after the LED chip array is bonded to the array substrate, and the LED chips are arranged in one-to-one correspondence with the pixel point regions of the transistor array layer, an anode connecting electrode connecting the anode of the LED chip and the source or the drain of the corresponding transistor, and a cathode connecting electrode in contact with the cathode of the LED chip are formed. The cathode connecting electrode is configured to connect a cathode low potential to cooperate with an anode high potential applied to the anode connecting electrode, for supplying power to the LED chip.

In one embodiment, when the LED chip array is transferred, it may only be required to embed the LED chip array into the adhesive film layer. The LED chip array is bonded to the array substrate through the adhesive film layer. Then, unnecessary portions of the adhesive film layer and unnecessary LED chips are removed, and the transfer process is finished. It is not necessary to attach LED chips in the LED chip array one by one to the substrate by soldering, in which case the process of fabricating the Micro LED display panel is simplified, the difficulty in fabricating the Micro LED display panel is reduced, the influence of the high temperature generated by the soldering process on the LED chips is avoided, and damage to the LED chips during the transfer process is avoided.

In the conventional technology, in order to limit the arrangement positions of the LED chips, a film layer such as a pixel definition layer is generally provided on the receiving substrate. The pixel definition layer has multiple openings, and the LED chips are located in the openings and are connected to the receiving substrate through soldering portions. Correspondingly, the LED chips are generally transferred one by one to the receiving substrate by means of a transfer head. Compared with the conventional technology, in the present disclosure, the LED chips are transferred and mounted by providing the adhesive film layer on the array substrate, and the pixel definition layer may not be required to be provided on the array substrate before the LED chips are transferred, thereby eliminating the limitation caused by the openings on the pixel definition layer. Therefore, the transfer substrate can be used to transfer the LED chips to the adhesive film layer, and the transfer substrate can transfer a large number of LED chips each time, thereby improving the transfer efficiency. On the other hand, after the film layer corresponding to the transistors in the array substrate is formed, the surface of the array substrate is generally not flat. In order to provide a flat surface for the subsequently formed structure, a planarization layer is generally provided. In the present disclosure, the adhesive film layer can function as the planarization film layer while functioning to secure the LED chips, which simplifies the film structure of the Micro LED display panel and reduces the thickness of the Micro LED display panel.

In the method for fabricating the Micro LED display panel according to one embodiment of the present disclosure, steps S2 to S4 may be required to be performed at least once such that the LED chips are in one-to-one correspondence with the pixel point regions of the transistor array layer. The number of times for which steps S2 to S4 are preformed may be determined according to colors of light emitted by the LED chips. If all the LED chips of the Micro LED display panel emit light of the same color, in the fabricating process of the Micro LED display panel, steps S2 to S4 may be required to be performed only once. That is, in a case that the LED chips of the Micro LED display panel emit light of the same color, the following steps S2 to S4 are performed once.

In step S2, an adhesive film layer is formed on a surface of the array substrate on which the transistor array layer is provided. The adhesive film layer includes a retaining region and a removal region.

In step S3, an LED chip array carried by a transfer substrate is embedded into the adhesive film layer, and the LED chip array is separated from the transfer substrate. The LED chip array includes multiple LED chips.

In step S4, the adhesive film layer is exposed and developed, to remove the removal region of the adhesive film layer and LED chips in the removal region. LED chips in the retaining region are in one-to-one correspondence with the pixel point regions of the transistor array layer.

It should be noted that if the size of the transfer substrate is smaller than the size of the region on the array substrate for receiving the transferred LED chips, all the LED chips can be transferred to the array substrate at multiple times even if all the LED chips of the Micro LED display panel emit light of the same color. In one embodiment, step S4 may be performed after all the LED chips are transferred.

Figure 3:
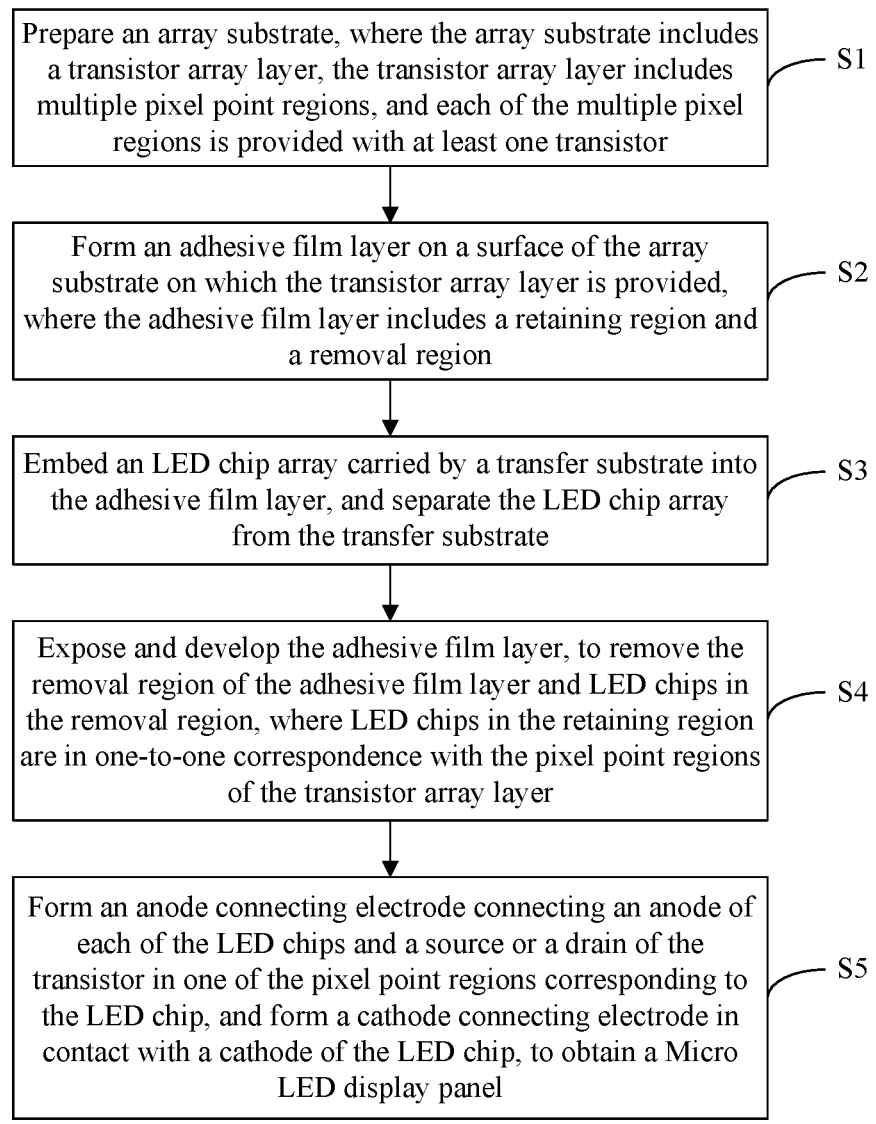
FIG. 3 is a flowchart of a method for fabricating a Micro LED display panel according to another embodiment of the present disclosure.

Reference is made to FIGS. 3 to 8, FIG. 3 is a flowchart of a method for fabricating a Micro LED display panel according to another embodiment of the present disclosure, and FIGS. 4 to 8 are schematic diagrams illustrating structures corresponding to the steps in FIG. 3. The LED chips of the Micro LED display panel emit light of the same color, and the method includes the following steps S1 to S5.

In step S1, an array substrate is provided. The array substrate includes a transistor array layer, the transistor array layer includes multiple pixel point regions, and each of the multiple pixel regions is provided with at least one transistor.

Figure 4:
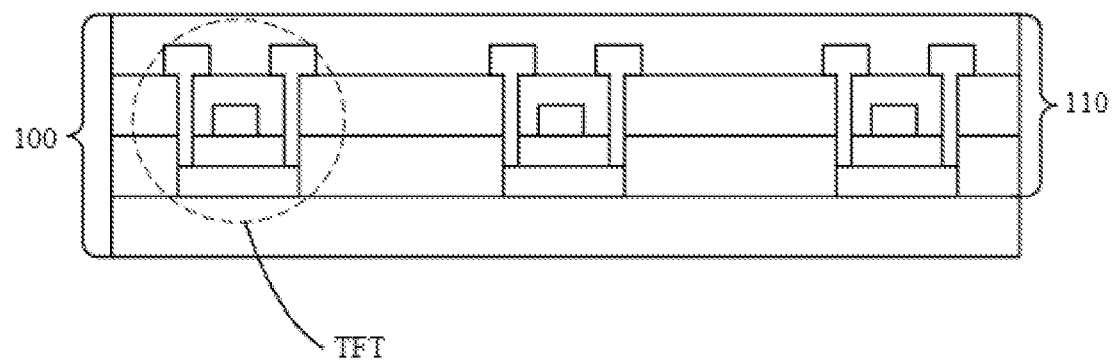
FIGS. 4 to 8 are schematic diagrams illustrating structures corresponding to the steps in FIG. 3.

As shown in FIG. 4, an array substrate 100 is provided. The array substrate 100 includes a transistor array layer 110, the transistor array layer 110 includes multiple pixel point regions (not shown), and each of the pixel point regions of the transistor array layer 110 is provided with at least one transistor TFT, where the transistor TFT is a thin film transistor. According to the present disclosure, the source and the drain of the transistor TFT may be exposed on the surface of the array substrate 100 facing the adhesive film layer to facilitate subsequent connection between the anode of the LED chip and the source or the drain of the transistor.

In an embodiment of the present disclosure, the transistor TFT for driving provided in the present disclosure may be a top-gate type thin film transistor or a bottom-gate type thin film transistor, which is not limited and needs to be designed according to practical applications.

In step S2, an adhesive film layer is formed on a surface of the array substrate on which the transistor array layer is provided. The adhesive film layer includes a retaining region and a removal region.

Figure 5:
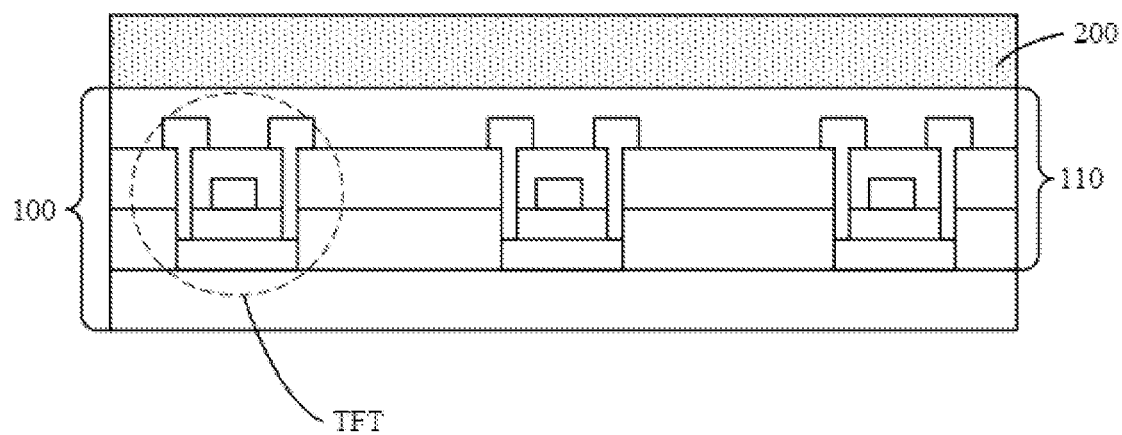

As shown in FIG. 5, an adhesive film layer 200 is formed on the surface of the array substrate 100 on which the transistor array layer 110 is provided. The adhesive film layer includes a retaining region and a removal region. The retaining region of the adhesive film layer corresponds to the pixel point regions of the transistor array layer, and the removal region of the adhesive film layer corresponds to a region outside the pixel point regions. The material of the adhesive film layer 200 is not limited in the present disclosure, and may be an organic material such as an epoxy resin.

In step S3, an LED chip array carried by a transfer substrate is embedded into the adhesive film layer, and the LED chip array is separated from the transfer substrate. The LED chip array includes multiple LED chips.

Figure 6:
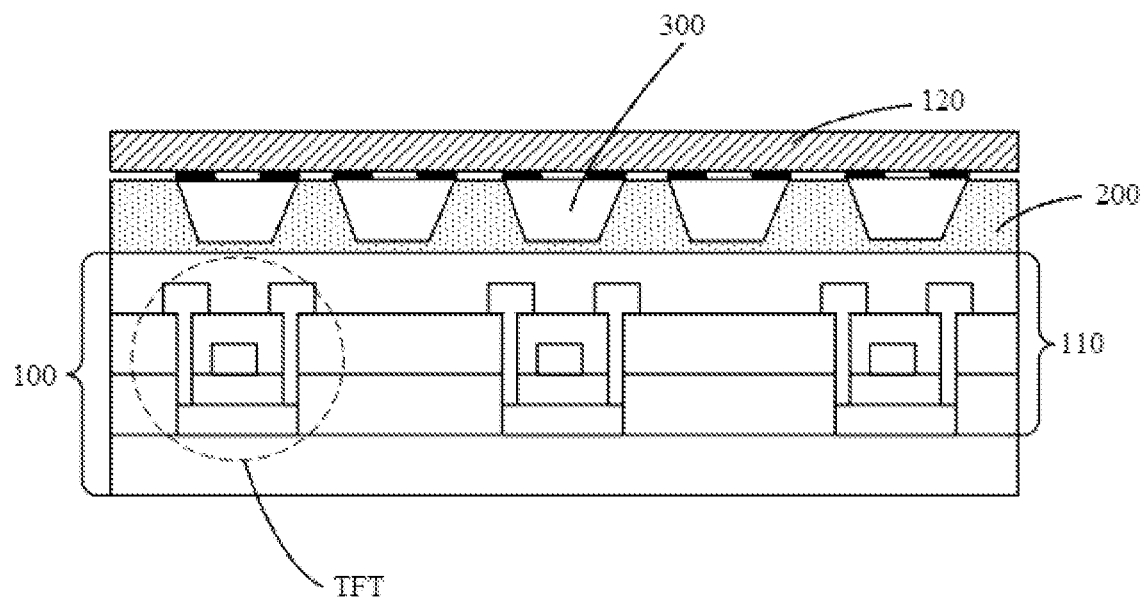

As shown in FIG. 6, an LED chip array is carried on a surface of a transfer substrate 120. The LED chip array includes multiple LED chips 300. The LED chips are Micro-LED chips, and the size of each of the Micro-LED chips is no greater than 100 micrometers. After the LED chips 300 are embedded into the adhesive film layer 200, the LED chip array is separated from the transfer substrate 120.

In an embodiment of the present disclosure, the LED chip array may be attached to the transfer substrate by an adhesive or through a magnetic force for transferring the LED chip array. If the LED chip array is attached to the transfer substrate by an adhesive, the adhesion force between the adhesive film layer and the LED chip array is greater than the adhesion force between the transfer substrate and the LED chip array.

In step S4, the adhesive film layer is exposed and developed, to remove the removal region of the adhesive film layer and LED chips in the removal region. LED chips in the retaining region are in one-to-one correspondence with the pixel point regions of the transistor array layer.

Figure 7:
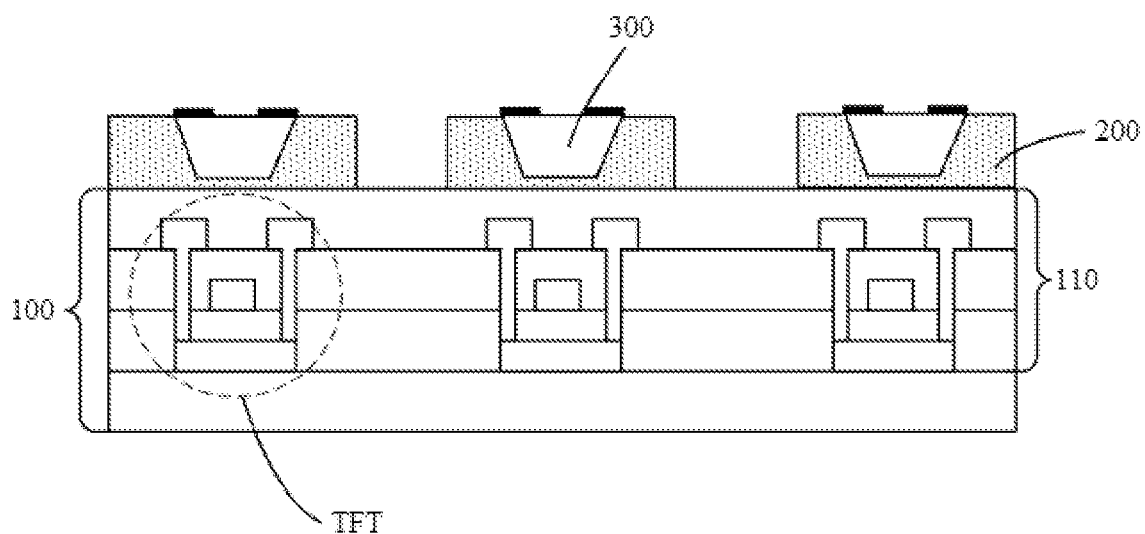

As shown in FIG. 7, the adhesive film layer 200 is exposed and developed, to remove the removal region of the adhesive film layer and the LED chips 300 attached to the removal region of the adhesive film layer. The LED chips 300 in the retaining region are in one-to-one correspondence with the pixel point regions of the transistor array layer. That is, in the finally obtained structure, each of the pixel point regions of the transistor array layer corresponds to one of the LED chips 300, and the transistor TFT is connected to the LED chip 300, such that the transistor TFT is used as a switch structure for supplying power to the LED chip.

In step S5, an anode connecting electrode and a cathode connecting electrode are formed, to obtain a Micro LED display panel. The anode connecting electrode connects an anode of each of the LED chips and a source or a drain of the transistor in one of the pixel point regions corresponding to the LED chip. The cathode connecting electrode is in contact with a cathode of the LED chip.

Figure 8:
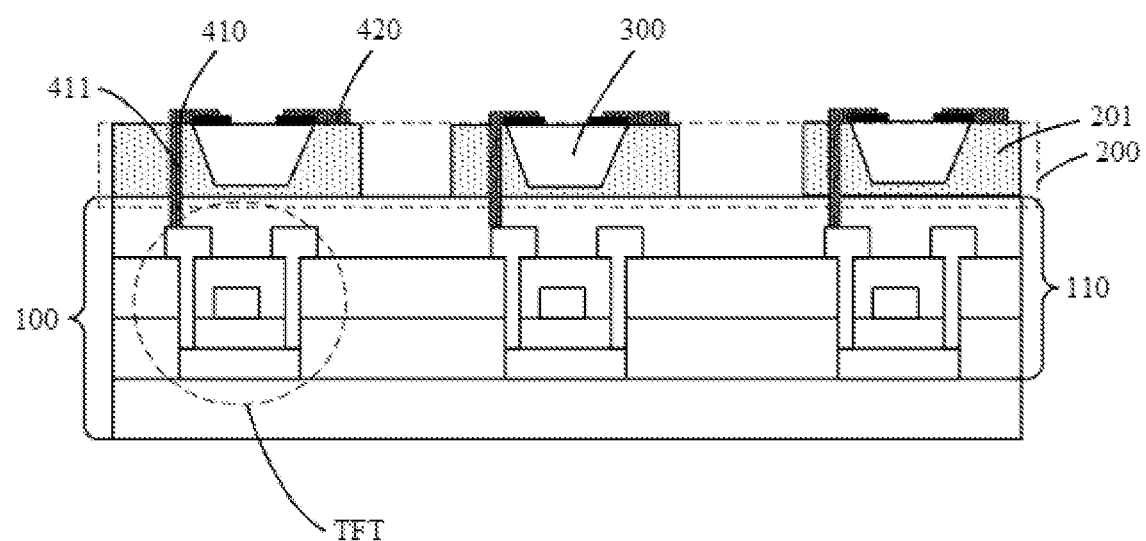

As shown in FIG. 8, after the LED chips 300 are transferred onto the array substrate 100, the retaining region of the adhesive film layer 200 may be cured (In one embodiment, the retaining region of the adhesive film layer may be cured during the exposure and development process in step S4, which is not limited in this disclosure). Then, an anode connecting electrode 410 that connects the anode of each of the LED chips 300 and the source or the drain of the corresponding one of the transistor TFTs, and a cathode connecting electrode 420 that in contact with the cathode of the LED chip are formed.

In an embodiment of the present disclosure, the anode and the cathode of each of the LED chips 300 may be provided on a side of the LED chips 300 facing away from the array substrate 100 to facilitate fabrication of a connection line for the anode and the cathode. In addition, the source and the drain of each of the transistor TFTs are exposed on the surface of the array substrate 100 facing the LED chips 300. Since the anode and the cathode of the LED chips 300 are arranged on the side of the LED chips 300 facing away from the array substrate 100, the anode may be connected to the source or the drain of the transistor TFT via a through hole extending through at least the adhesive film layer 200.

In an embodiment of the present disclosure, in a case that all the LED chips according to the present disclosure emit light of the same color, a light conversion film layer may be provided on the light emitting side of the structure formed by the LED chips and the array substrate, to obtain light of different colors through the light conversion film. That is, the method for fabricating a Micro LED display panel according the embodiments of the present disclosure further includes: forming a light conversion film layer on a side of the array substrate facing away from the LED chips or a side of the LED chips facing away from the array substrate.

The light conversion film layer includes multiple light conversion regions which are in one-to-one correspondence with the LED chips. Each of the multiple light conversion regions is configured to convert color of light emitted by a corresponding one of the LED chips into one of M colors, and M is a positive integer not less than 2.

Figure 9:
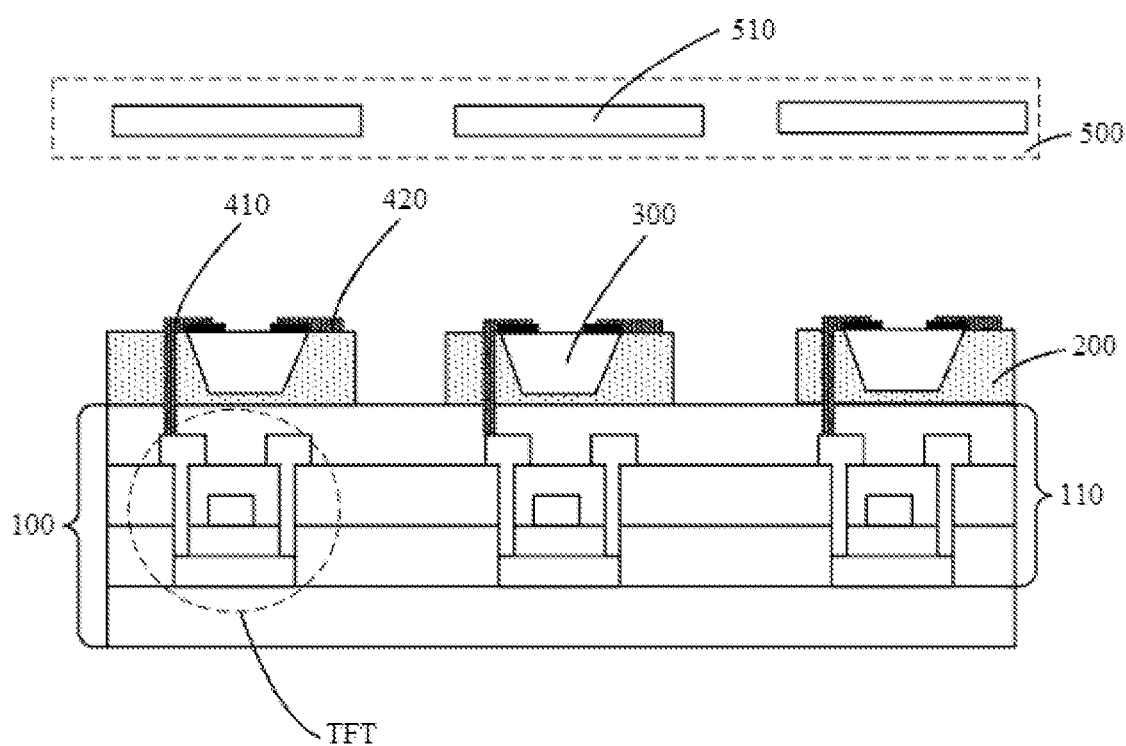
FIG. 9 is a schematic structural diagram of a micro LED display panel according to an embodiment of the present disclosure.

As shown in FIG. 9, which is a schematic structural diagram of a micro LED display panel according to an embodiment of the present disclosure, a light emitting side of the display panel is the side of the LED chips 300 facing away from the array substrate 100, and the side of the LED chips 300 facing away from the array substrate 100 is further provided with a light conversion film layer 500.

The light conversion film layer 500 includes multiple light conversion regions 510 which are in one-to-one correspondence with the LED chips 300. Each the light conversion region 510 functions to convert the color of light emitted by the corresponding one of the LED chips 300 into one of M colors, where M is a positive integer not less than 2. For example, each of the light conversion regions can convert the color of light emitted by one of the LED chips into one of red, green and blue.

In an embodiment of the present disclosure, the LED chips included in the micro LED display panel may emit light of different colors. In this case, steps S2 to S4 are performed multiple times during fabrication of the micro LED display panel. That is, the LED chips of the Micro LED display panel according to the embodiments of the present disclosure emit light of N colors, and the transistor array layer includes N pixel point regions respectively corresponding to the LED chips emitting light of N colors, where N is an integer not less than 2, the N pixel point regions includes first pixel point regions to N-th pixel point regions, and the N colors includes a first color to an N-th color. In this case, steps S2 to S4 are performed N times.

First, the following steps S2 to S4 are performed for the first time.

In step S2, a first adhesive film layer is formed on the surface of the array substrate on which the transistor array layer is provided. The first adhesive film layer includes a first retaining region and a first removal region.

In step S3, a first LED chip array carried by a transfer substrate is embedded into the first adhesive film layer, and the first LED chip array is separated from the transfer substrate. The first LED chip array includes LED chips emitting light of the first color.

In step S4, the first adhesive film layer is exposed and developed, to remove the first removal region of the first adhesive film layer and LED chips emitting light of the first color in the first removal region. LED chips emitting light of the first color in the first retaining region are in one-to-one correspondence with the first pixel point regions of the transistor array layer.

Next, the following steps S2 to S4 are performed for the second time.

In step S2, a second adhesive film layer is formed on the side of the array substrate on which the transistor array layer is provided. The second adhesive film layer covers at least an exposed surface of the array substrate, and the second adhesive film layer includes a second retaining region and a second removal region.

In step S3, a second LED chip array carried by the transfer substrate is embedded into the second adhesive film layer, and the second LED chip array is separated from the transfer substrate. The second LED chip array includes LED chips emitting light of the second color.

In step S4, the second adhesive film layer is exposed and developed, to remove the second removal region of the second adhesive film layer, and LED chips emitting light of the second color in the second removal region. LED chips emitting light of the second color in the second retaining region are in one-to-one correspondence with the second pixel point regions of the transistor array layer.

By such analogy, steps S2 to S4 are performed for N-th times, to obtain a structure in which the LED chips emitting light of the i-th color in the i-th retaining region are in one-to-one correspondence with the i-th pixel point regions, where i is a positive integer not greater than N.

In the following, a case where steps S2 to S4 are performed twice is described in detail as an example in conjunction with the drawings. FIGS. 10 to 15 are schematic diagrams illustrating structures corresponding to the respective steps when steps S2 to S4 are performed twice.

First, steps S2 to S4 are performed for the first time.

Figure 10:
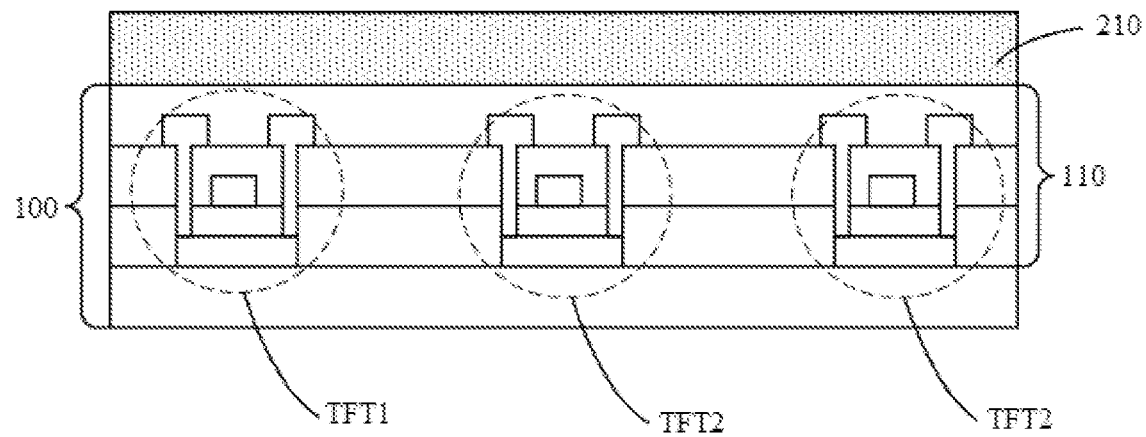
FIGS. 10 to 15 are schematic diagrams illustrating structures corresponding to the respective steps when steps S2 to S4 are performed twice.

As shown in FIG. 10 which illustrates a structure corresponding to step S2, a first adhesive film layer 210 is formed on the surface of the array substrate 100 on which the transistor array layer 110 is provided. The first adhesive film layer 210 includes a first retaining region and a first removal region. The first retaining region of the first adhesive film layer 210 corresponds to the first pixel point region, and the first removal region of the first adhesive film layer 210 corresponds to a region outside the first pixel point region. The first pixel point region of the transistor array layer 110 is provided with a first transistor TFT1.

Figure 11:
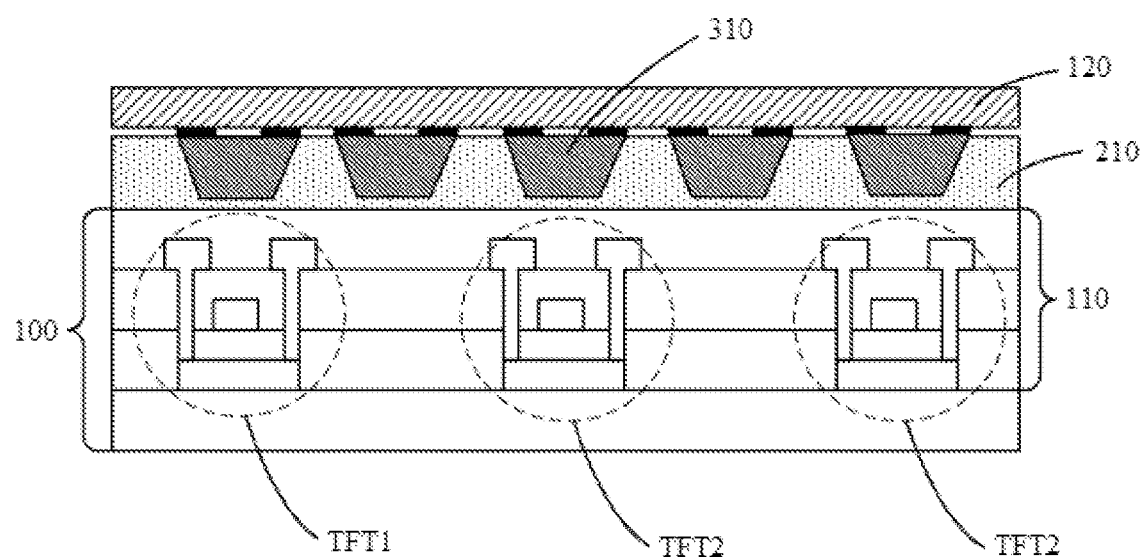

As shown in FIG. 11 which illustrates a structure corresponding to step S3, a first LED chip array is carried on a surface of the transfer substrate 120, and the first LED chip array includes multiple LED chips 310 emitting light of a first color. The LED chips 310 emitting light of the first color are embedded into the first adhesive film layer 210, and the first LED chip array is separated from the transfer substrate 120.

Figure 12:
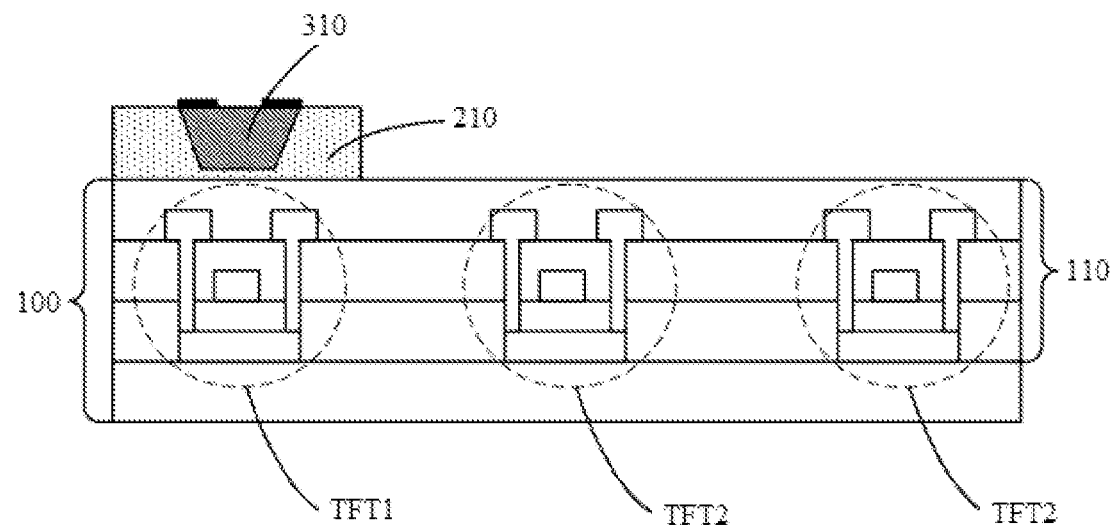

As shown in FIG. 12 which illustrates a structure corresponding to to step S4, the first adhesive film layer 210 is exposed and developed, to remove the first removal region of the first adhesive film layer 210 and the LED chips 310 emitting light of the first color attached to the first removal region of the first adhesive film layer 210. The LED chips 310 emitting light of the first color attached to the first retaining region are in one-to-one correspondence with the first pixel point regions of the transistor array layer 110.

Then, steps S2 to S4 are performed for the second time.

Figure 13:
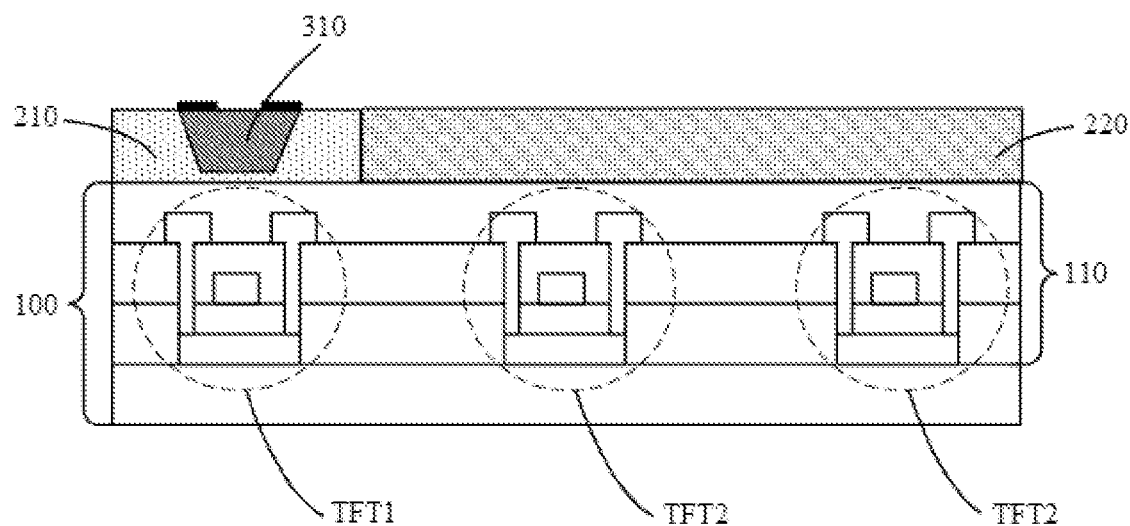

As shown in FIG. 13 which illustrates a structure corresponding to step S2, a second adhesive film layer 220 is formed on the surface of the array substrate 100 on which the transistor array layer 110 is provided. The second adhesive film layer 220 covers at least an exposed surface of the array substrate 100. The second adhesive film layer 220 includes a second retaining region and a second removal region, where the second retaining region of the second adhesive film layer 220 corresponds to the second pixel point region, and the second removal region of the second adhesive film layer 210 corresponds to a region outside the second pixel point region. The second pixel point region of the transistor array layer 110 is provided with a second transistor TFT2.

Figure 14:
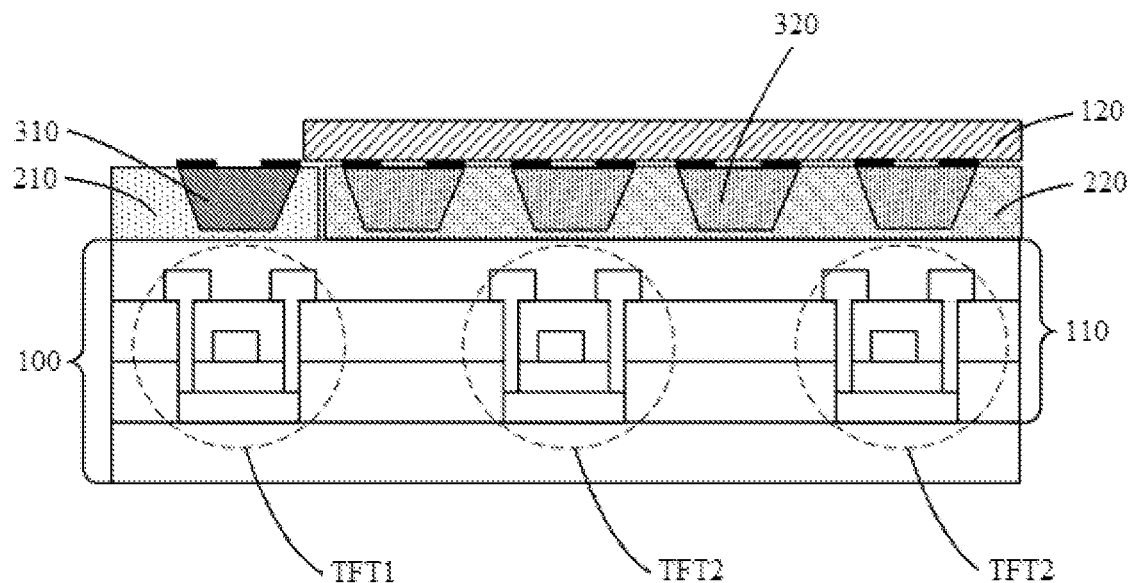

As shown in FIG. 14 which illustrates a structure corresponding to step S3, a second LED chip array is carried on a surface of the transfer substrate 120, and the second LED chip array includes multiple LED chips 320 emitting light of a second color. The LED chips 320 emitting light of the second color are embedded into the second adhesive film layer 220, and the second LED chip array is separated from the transfer substrate 120.

Figure 15:
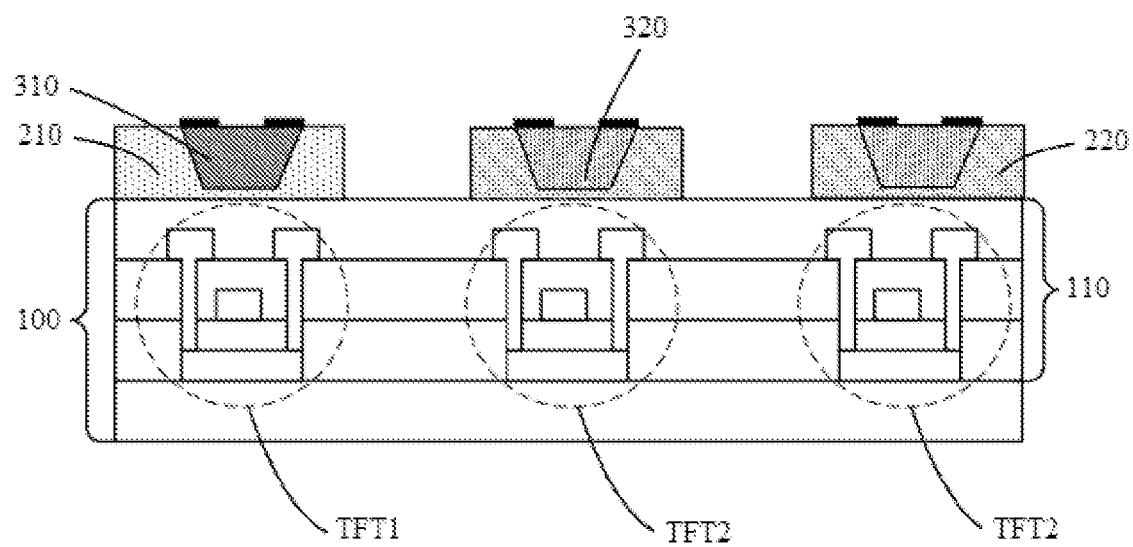

As shown in FIG. 15 which illustrates a structure corresponding to step S4, the second adhesive film layer 220 is exposed and developed, to remove the second removal region of the second adhesive film layer 220 and the LED chips 320 emitting light of the second color attached to the second removal region of the second adhesive film layer 220. The LED chips 320 emitting light of the second color attached to the second retaining region are in one-to-one correspondence with the second pixel point regions of the transistor array layer 110.

In an embodiment of the present disclosure, LED chips according to the present disclosure may emit red light, green light and blue light, which are not limited herein.

In any one of the above embodiments of the present disclosure, in the LED chip array, the anode and the cathode of each of the LED chips are exposed on a side of the LED chips facing away from the array substrate, and step S4 further includes:

exposing and developing the adhesive film layer to form a through hole corresponding to the source or the drain of the transistor, where the anode connecting electrode is electrically connected to the source or the drain of the transistor via the through hole.

As shown in FIG. 8, the anode and the cathode according to one embodiment of the present disclosure are exposed on the side of the LED chips 300 facing away from the array substrate, where the anode connecting electrode 410 is electrically connected to the source or the drain of the transistor TFT via the through hole 411.

It should be noted that, in a case that the source and the drain of the transistor are exposed on the surface of the array substrate on which the transistor array layer is provided, the anode connecting electrode may be directly connect to the source or the drain of the transistor via the through hole. If the source and the drain of the transistor are covered by the surface of the array substrate on which the transistor array layer is provided, on the basis of the through hole extending through the adhesive film layer, etching is further performed until the source or the drain are exposed, such that the source or the drain is in contact with the anode connecting electrode. In one embodiment, the transistor array layer may include a passivation film layer covering the source and the drain of the transistor, that is, a surface of the array substrate covering the source and the drain of the transistor is a surface of the passivation film layer, and the source and drain of the transistor are protected from being scratched by the passivation film layer.

Further, after the anode connecting electrode and the cathode connecting electrode are formed, that is, after step S5, the method further includes the following step S6.

In step S6, a protective film layer is formed on a side of the LED chips facing away from the array substrate.

It should be understood that, after the anode connecting electrode and the cathode connecting electrode are formed, the anode connecting electrode, the cathode connecting electrode, the surface of the LED chips which faces away from the array substrate and is not covered by the anode connecting electrode and the cathode connecting electrode are exposed. In this case, the anode connecting electrode, the cathode connecting electrode, the surface of the LED chips which faces away from the array substrate and is not covered by the anode connecting electrode and the cathode connecting electrode are covered by the protective film layer to protect the LED chips from damage.

Figure 16:
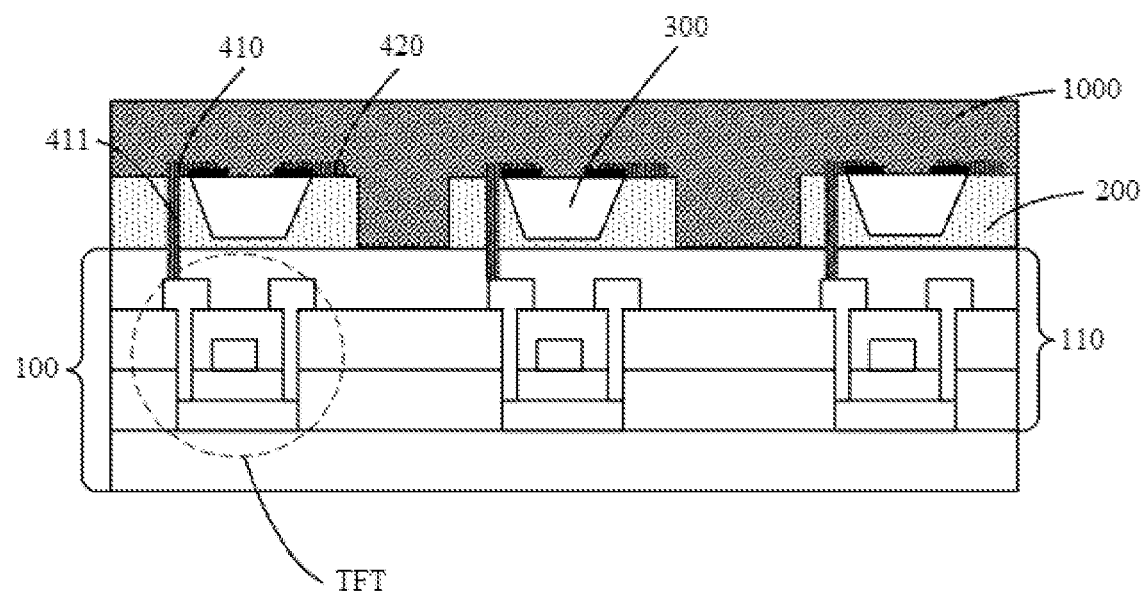
FIG. 16 is a schematic structural diagram of a Micro LED display panel according to another embodiment of the present disclosure.

FIG. 16 is a schematic structural diagram of a Micro LED display panel according to another embodiment of the present disclosure. A protective film layer 1000 is provided on a side of the LED chips 300 facing away from the array substrate 100, where the protective film layer 1000 covers the exposed surface of the LED chips 300 facing away from the array substrate 100.

Further, the protective film layer 1000 covers not only the exposed surface of the LED chips 300 facing away from the array substrate 100 but also the exposed surface of array substrate 100 facing the LED chips 300.

In an embodiment of the present disclosure, the protective film layer may be an inorganic film layer. The LED chip array is protected from being scratched by the inorganic film layer, and the water vapor is also prevented from eroding the LED chip array.

In any of the above embodiments, the LED chip array according to the present disclosure may be attached with the transfer substrate by an adhesive, where the adhesion force between the LED chip array and the adhesive film layer is greater than the adhesion force between the LED chip array and the transfer substrate.

It can be understood that the LED chip array may be attached with the transfer substrate by a simple process which is easy to implement.

Correspondingly, a Micro LED display panel is provided according to an embodiment of the present disclosure. As shown in FIG. 8, the Micro LED display panel includes an array substrate 100, an adhesive film layer 200, and multiple LED chips 300.

The array substrate 100 includes a transistor array layer 110. The transistor array layer 110 include multiple pixel point regions (not shown), and each of the pixel point regions of the transistor array layer 110 is provided with at least one transistor TFT.

The adhesive film layer 200 is located on a surface of the array substrate on which the transistor array layer 110 is provided.

The multiple LED chips 300 are embedded in the adhesive film layer 200, where the LED chips 300 are in one-to-one correspondence with the pixel point regions of the transistor array layer 110. An anode of each of the LED chips 300 is connected with a source or a drain of a corresponding one of the transistors TFT through a anode connecting electrode 410, and a cathode of each of the LED chips 300 is connected to the cathode connecting electrode 420.

In an embodiment of the present disclosure, the LED chips of the Micro LED display panel emit light of the same color.

In this embodiment, the Micro LED display panel further includes a light conversion film layer on a side of the array substrate facing away from the LED chips or a side of the LED chips facing away from the array substrate.

The light conversion film layer includes multiple light conversion regions which are in one-to-one correspondence with the LED chips. Each of the multiple light conversion regions is configured to convert a color of light emitted by a corresponding one of the LED chips into one of M colors, where M is a positive integer not less than 2.

As shown in FIG. 9, a light emitting side of the display panel is the side of the LED chips 300 facing away from the array substrate 100. A light conversion film layer 500 is provided on the side of the LED chips 300 facing away from the array substrate 100.

The light conversion film layer 500 includes multiple light conversion regions 510. Each of the light conversion regions 510 is configured to convert a color of light emitted by one of the LED chips 300 into one of M colors, where M is a positive integer not less than 2. The light conversion regions 510 are in one-to-one correspondence with the LED chips 300. For example, each of the light conversion regions converts the color of light emitted by a corresponding one of the LED chips into one of red, green and blue.

In one embodiment, in an embodiment of the present disclosure, the LED chips of the Micro LED display panel provided according to the present disclosure include LED chips emitting light of N colors, where N is an integer not less than 2. The LED chips according to the present disclosure may include LED chips emitting red light, LED chips emitting green light and LED chips emitting blue light, which are not limited herein.

As shown in FIG. 8, in the LED chip array, the anode and the cathode of each of the LED chips 300 are exposed on the a side of the LED chips 300 facing away from the array substrate 100.

The adhesive film layer 200 includes multiple through holes 411. The anode connecting electrode 410 is electrically connected to the source or the drain of the corresponding transistor TFT via one of the through holes 411.

It should be noted that, in a case that the source and the drain of the transistor are exposed on the surface of the array substrate on which the transistor array layer is provided, the anode connecting electrode may be directly connect to the source or the drain of the transistor via the through hole. If the source and the drain of the transistor are covered by the surface of the array substrate on which the transistor array layer is provided, on the basis of the through hole extending through the adhesive film layer, etching is further performed until the source or the drain are exposed, such that the source or the drain is in contact with the anode connecting electrode. In one embodiment, the transistor array layer may include a passivation film layer covering the source and the drain of the transistor, that is, a surface of the array substrate covering the source and the drain of the transistor is a surface of the passivation film layer, and the source and drain of the transistor are protected from being scratched by the passivation film layer.

Figure 17:
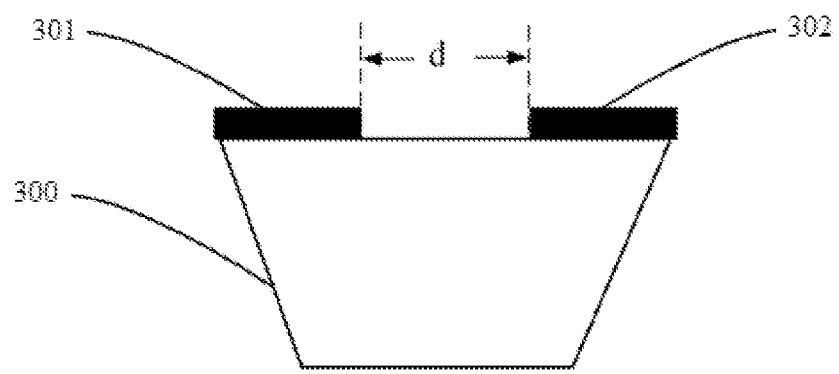
FIG. 17 is a schematic structural diagram of an LED chip according to an embodiment of the present disclosure.

Further, as shown in FIG. 17, which is a schematic structural diagram of an LED chip according to an embodiment of the present disclosure, in order to avoid shorting between the anode and the cathode of the LED chip, an interval d between the anode 301 and the cathode 302 of the LED chip 300 is greater than 6 μm.

In any of the above embodiments, the adhesive film layer according to the present disclosure may be made of an organic material such as an epoxy resin. When the adhesive film layer is exposed and developed, the retaining region of the adhesive film layer is covered by a mask, and the removal region of the adhesive film layer is irradiated by UV light to cause a reaction, then a developer is sprayed on the adhesive film layer for dissolving the removal region of the adhesive film layer. The retaining region of the adhesive film layer that is not irradiated by UV light is retained.

In any of the above embodiments, the anode connecting electrode and the cathode connecting electrode according to the present disclosure may be transparent electrodes. The transparent electrodes are provided to ensure a large beam angle and a large light emitting area of the LED chip.

In any of the above embodiments of the present disclosure, as shown in FIG. 8, the depth at which the LED chips 300 are embedded in the adhesive film layer 200 is less than the thickness of the adhesive film layer 200, so that the bottom surface of the LED chips 300 facing the array substrate 100 is not in contact with the surface of the array substrate 100, thereby avoiding scratching of the surface of the array substrate 100 and damage to the LED chips 300.

In any of the above embodiments, as shown in FIG. 8, the adhesive film layer 200 includes multiple adhesive portions 201 which are in one-to-one correspondence with the LED chips 300. A projection of each of the LED chips on the adhesive film layer is located in the corresponding adhesive portion, and adjacent ones of the adhesive portions are provided at an interval, for releasing the stress of the adhesive film layer, thereby reducing the probability of warping of the film layer. Meanwhile, the heat release efficiency of the LED chips can be improved by the intervals between the adjacent ones of the adhesive portions 201, thereby improving heat dissipation.

Correspondingly, a Micro LED display device, including the Micro LED display panel according to any of the above embodiments is further provided according to one embodiment of the present disclosure.

A Micro LED display panel, a method for fabricating the Micro LED display panel, and a display device are provided according to the present disclosure. A Micro LED display panel is fabricated by the following process. First, the adhesive film layer is formed on the surface of the carrier substrate or the surface of the array substrate on which the transistor array layer is provided. Then, the LED chip array carried by the transfer substrate is embedded into the adhesive film layer, and the LED chip array is separated from the transfer substrate. Next, the adhesive film layer is exposed and developed to remove the removal region of the adhesive film layer and the LED chips in the removal region. After the LED chip array is bonded to the array substrate, the LED chips in the removal region are removed, and the LED chips in the retaining region have one-to-one correspondence with the pixel point regions in the transistor array layer. Then, the anode connecting electrode that connects the anode of each of the LED chips and the source or the drain of the corresponding transistor, and the cathode connecting electrode that is in contact with the cathode of the LED chip are formed.

In one embodiment, when the LED chip array is transferred, it may only be required to embed the LED chip array into the adhesive film layer. The LED chip array is bonded to the carrier substrate or the array substrate through the adhesive film layer. Then, unnecessary portions of the adhesive film layer and unnecessary LED chips are removed, and the transfer process is finished. It is not necessary to attach LED chips in the LED chip array one by one to the substrate by soldering, in which case the process of fabricating the Micro LED display panel is simplified, the difficulty in fabricating the Micro LED display panel is reduced, the influence of the high temperature generated by the soldering process on the LED chips is avoided, and damage to the LED chips during the transfer process is avoided.

It should be noted that, in the drawings of the present disclosure, the LED chips is schematically shown in a shape in which the cross section is trapezoidal. However, the shape of the LED chips is not limited thereto in the present disclosure.

The invention claimed is:

1. A method for fabricating a Micro LED display panel, comprising:

step S1, preparing an array substrate, wherein the array substrate comprises a transistor array layer, the transistor array layer comprises a plurality of pixel point regions, and each of the plurality of pixel regions is provided with at least one transistor;

performing steps S2 to S4 at least once, comprising:
step S2, forming an adhesive film layer on a surface of the array substrate on which the transistor array layer is provided, wherein the adhesive film layer comprises a retaining region and a removal region,
step S3, embedding an LED chip array carried by a transfer substrate into the adhesive film layer, and separating the LED chip array from the transfer substrate, wherein the LED chip array comprises a plurality of LED chips, and
step S4, exposing and developing the adhesive film layer, to remove the removal region of the adhesive film layer and LED chips in the removal region, wherein LED chips in the retaining region are in one-to-one correspondence with the pixel point regions of the transistor array layer; and step S5, forming an anode connecting electrode connecting an anode of each of the LED chips and a source or a drain of the transistor in one of the pixel point regions corresponding to the LED chip, and forming a cathode connecting electrode in contact with a cathode of the LED chip, to obtain a Micro LED display panel.

2. The method for fabricating a micro LED display panel according to claim 1, wherein the LED chips of the Micro LED display panel emit light of a same color, and steps S2 to S4 are performed once.

3. The method for fabricating a micro LED display panel according to claim 2, further comprising:
forming a light conversion film layer on a side of the array substrate facing away from the LED chips or a side of the LED chips facing away from the array substrate, wherein the light conversion film layer comprises a plurality of light conversion regions which are in one-to-one correspondence with the LED chips, each of the plurality of light conversion regions is configured to convert color of light emitted by a corresponding one of the LED chips into one of M colors, and M is a positive integer not less than 2.

4. The method for fabricating a micro LED display panel according to claim 1, wherein
the LED chips of the Micro LED display panel comprise LED chips emitting light of N colors, N being an integer not less than 2,
the transistor array layer comprises N pixel point regions respectively corresponding to the LED chips emitting light of N colors, wherein the N pixel point regions comprises first pixel point regions to N-th pixel point regions, and the N colors comprises a first color to an N-th color, and
steps S2 to S4 are performed N times, comprising:
performing steps S2 to S4 for the first time, comprising:
step S2, forming a first adhesive film layer on the surface of the array substrate on which the transistor array layer is provided, wherein the first adhesive film layer comprises a first retaining region and a first removal region,
step S3, embedding a first LED chip array carried by a transfer substrate into the first adhesive film layer, and separating the first LED chip array from the transfer substrate, wherein the first LED chip array comprises LED chips emitting light of the first color, and
step S4, exposing and developing the first adhesive film layer, to remove the first removal region of the first adhesive film layer and LED chips emitting light of the first color in the first removal region, wherein LED chips emitting light of the first color in the first retaining region are in one-to-one correspondence with the first pixel point regions of the transistor array layer, and
performing steps S2 to S4 for an i-th time, i being greater than 1 and less than or equal to N, comprising:
step S2, forming an i-th adhesive film layer on the side of the array substrate on which the transistor array layer is provided, wherein the i-th adhesive film layer covers at least an exposed surface of the array substrate, and the i-th adhesive film layer comprises an i-th retaining region and an i-th removal region,
step S3, embedding an i-th LED chip array carried by the transfer substrate into the i-th adhesive film layer, and separating the i-th LED chip array from the transfer substrate, wherein the i-th LED chip array comprises LED chips emitting light of the i-th color, and
step S4, exposing and developing the i-th adhesive film layer, to remove the i-th removal region of the i-th adhesive film layer, and LED chips emitting light of the i-th color in the i-th removal region, wherein LED chips emitting light of the i-th color in the i-th retaining region are in one-to-one correspondence with the i-th pixel point regions of the transistor array layer.

5. The method for fabricating a micro LED display panel according to claim 1, wherein an anode and a cathode of each of the LED chips in the LED chip array are exposed at a side of the LED chips facing away from the carrier substrate, and step S4 further comprises:
exposing and developing the adhesive film layer to form a through hole corresponding to the source or the drain of the transistor, wherein the anode connecting electrode is electrically connected to the source or the drain of the transistor via the through hole.

6. The method for fabricating a micro LED display panel according to claim 1, further comprising: after the anode connecting electrode and the cathode connecting electrode are formed:
forming a protective film layer on a side of the LED chips facing away from the array substrate.

7. The method for fabricating a micro LED display panel according to claim 1, wherein the LED chip array is attached with the transfer substrate by an adhesive, and an adhesion force between the LED chip array and the adhesive film layer is greater than an adhesion force between the LED chip array and the transfer substrate.

* * * * *